United States Patent [19]

Monticelli

[11] Patent Number: 4,570,128
[45] Date of Patent: Feb. 11, 1986

[54] CLASS AB OUTPUT CIRCUIT WITH LARGE SWING

[75] Inventor: Dennis M. Monticelli, Fremont, Calif.

[73] Assignee: National Semiconductor Corporation, Santa Clara, Calif.

[21] Appl. No.: 628,101

[22] Filed: Jul. 5, 1984

[51] Int. Cl.[4] ............................ H03F 3/18; H03F 3/26
[52] U.S. Cl. ...................................... 330/267; 330/264
[58] Field of Search ............... 330/263, 264, 267, 268, 330/277, 302, 311

[56] References Cited

U.S. PATENT DOCUMENTS 3,611,170 10/1971 Wheatley, Jr. ................. 330/257 X Primary Examiner—Eugene R. LaRoche
Assistant Examiner—Steven J. Mottola
Attorney, Agent, or Firm—Gail W. Woodward; Paul J. Winters; Michael J. Pollock

[57] ABSTRACT

An output stage is disclosed wherein class AB bias is employed. The stage is quiescently biased by means of current mirrors so that the bias is controlled mainly by ratioed geometric elements. The output transistors are biased by means of unity gain common gate drivers that provide the desired level shifting. The output voltage can be swung from from close to the rail potential of the source of the n channel output transistor to close to the rail potential of the source of the p channel transistor. The circuit can drive relatively large load currents and can be fabricated using either CMOS or conventional bipolar integrated circuits.

12 Claims, 3 Drawing Figures

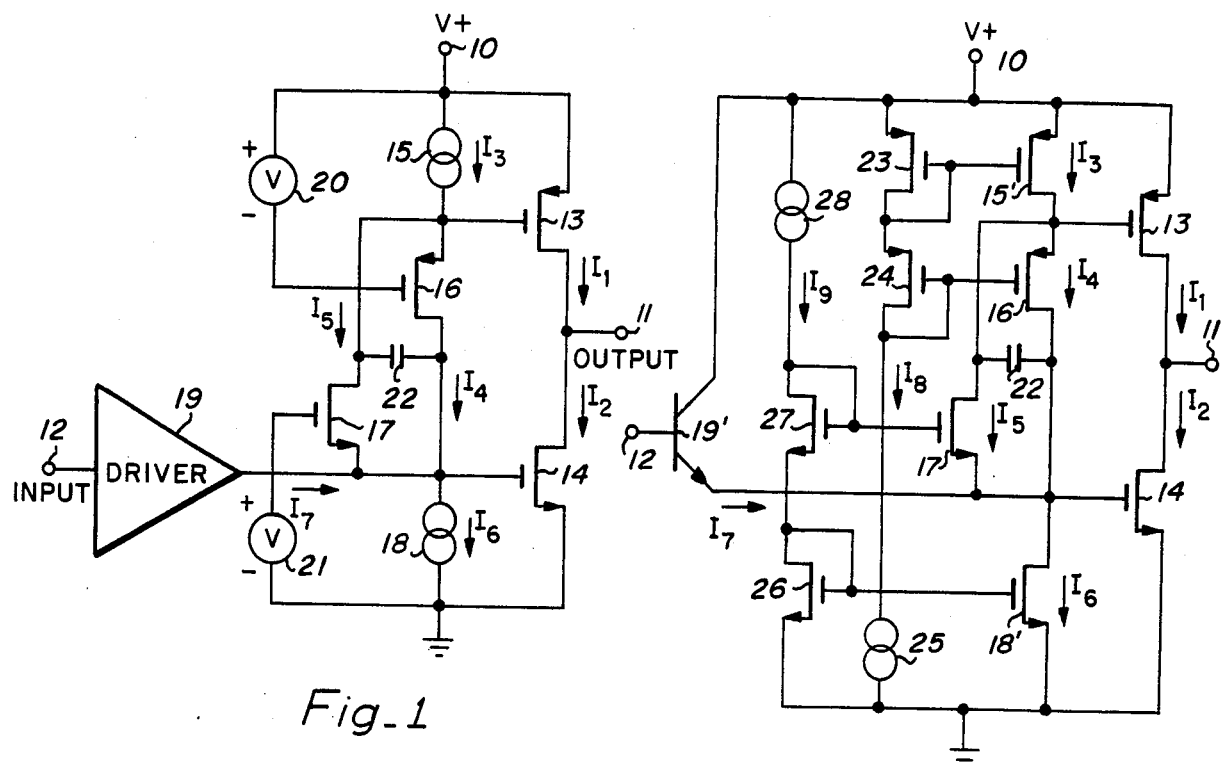
Fig_1
Fig_2
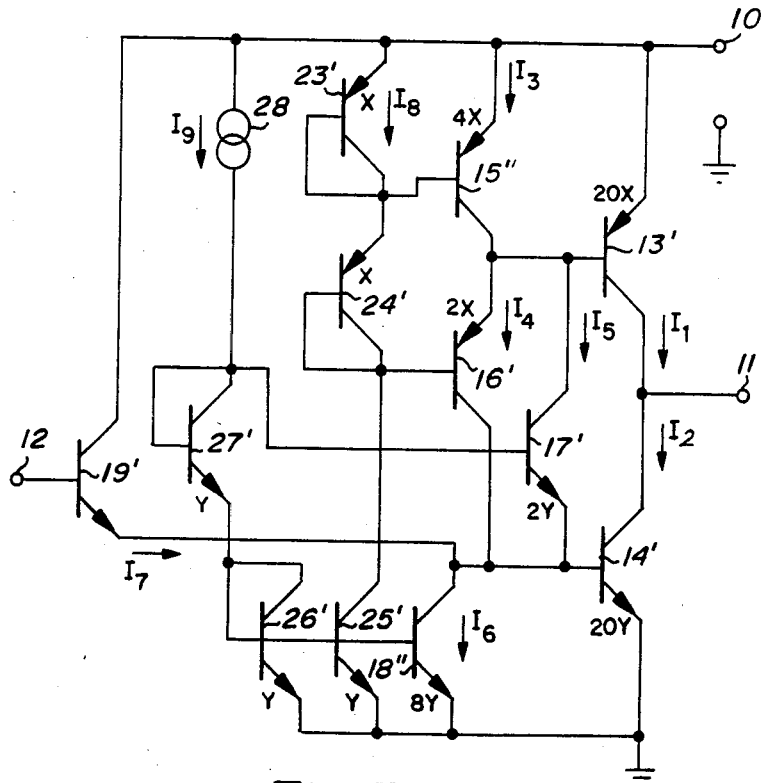
Fig_3

CLASS AB OUTPUT CIRCUIT WITH LARGE SWING

BACKGROUND OF THE INVENTION

Complementary metal oxide semiconductor (CMOS) integrated circuits are well known in the semiconductor art. In fact, digital IC CMOS devices have captured a wide segment of the IC market. More recently the CMOS approach has been applied to linear circuit applications. In many cases an IC will require linear as well as digital functions on a single chip. It has been a desired goal to implement linear circuits in CMOS form without sacrificing the excellent performance that has been attained using bipolar device technology. In the present case it is desired to produce a class AB amplifier output stage using either bipolar or CMOS transistors that can act to drive relatively heavy loads and swing very close to the supply potentials.

SUMMARY OF THE INVENTION

It is an object of the invention to produce a transistor output stage having class AB characteristics.

It is a further object of the invention to operate a transistor amplifier output stage in class AB so that heavy loads can be driven in push pull with rail to rail drive capability and wherein the stage is insensitive to supply voltage variations, process variations and temperature.

These and other objects are obtained using a circuit configured as follows. A complementary output transistor pair of relatively large size is coupled between the power supply rails with their drains (or collectors) providing the stage output. The gates (or bases) of the output pair are coupled together by a complementary pair of parallel connected drivers that act as common gate (or base) level shifters. Quiescent bias or the output pair is obtained from a complementary pair of constant current transistors that are operated as current mirrors. The current mirror inputs are obtained from relatively low current source and sink supplies. The transistor sizes are ratioed so that the output pair quiescent current is a relatively large multiple of current mirror inputs. A bipolar transistor emitter follower is employed to drive the gate (or base) of one of the output transistors.

While the output stage is described in detail in terms of CMOS devices, it can be constructed in bipolar transistor form.

BRIEF DESCRIPTION OF THE DRAWING

FIG. 1 is a simplified schematic diagran of the circuit of the invention.

FIG. 2 is a CMOS schematic diagram of the circuit of the invention.

FIG. 3 is a bipolar transistor schematic diagram of the circuit of the invention.

DESCRIPTION OF THE INVENTION

In FIG. 1 the circuit is operated from a power supply connected + to terminal 10 and − to ground. The output stage has an output at terminal 11 that responds to the input of terminal 12. A large area P channel output transistor 13 is coupled in series with a large area N channel output transistor 14 so that both conduct the same quiescent current. For this condition $I_1 = I_2$. As will be shown hereinafter these output transistors are desirably scaled so that they have substantially the same gain.

A current source 15 conducts $I_3$ from terminal 10 to the gate of transistor 13. $I_3$ is split into two parts $I_4$ and $I_5$ which flow respectively in complemetary transistors 16 and 17 which are connected between the gates of transistors 13 and 14.

A current sink 18 conducts $I_6$ from the gate of transistor 14 to ground. Driver 19 modulates a current $I_7$ which is coupled to flow in sink 18 as a part of $I_6$. $I_6 = I_4 + I_5 + I_7$. A constant voltage source 20 maintains the gate of transistor 16 at two P channel transistors thresholds below the potential at terminal 10. Another constant voltage source 21 maintains the gate of transistor 17 at two n channel transistor thresholds above ground. This biasing arrangement causes transistors 16 and 17 to operate as common gate unity gain voltage level shifters.

As driver 19 modulates $I_7$ under small signal conditions, the potential at the gate of transistor 14 will be varied, thus varying $I_2$. As $I_7$ increases, the potential at the gate of transistor 14 will rise and $I_5$ will decrease because $I_6$ is constant. This will raise the potential at the gate of transistor 13 and thereby decrease $I_1$ so that terminal 11 will sink current. Since the drain of transistor 17 looks into the source of transistor 16 the common gate connection will produce unity gain from the gate of transistor 14 to the gate of transistor 13. In the converse, as driver 19 reduces $I_7$, $I_5$ will have to increase. This will lower the potential on the gate of transistor 14 and $I_2$ will fall. The action of transistor 17 will pull the potential at the gate of transistor 13 down thereby increasing $I_1$ so that terminal 11 will source current. Thus, transistors 13 and 14 are driven in push pull.

It is to be understood that while driver 19 is shown coupled directly to the gate of transistor 14 it could be coupled to the gate of transistor 13. If this connection alternative is employed, the driver current, $I_7$ would flow as components of $I_3$, $I_4$ and $I_5$.

Capacitor 22 which is coupled between the gates of transistors 13 and 14 frequency compensates the amplifier. In effect it acts as a feed-forward element that is particularly useful under large signal conditions. In such a circumstance, terminal 12 is taken very low causing $I_4$ to decrease to nearly zero as the gate of transistor 13 falls. A high impedance then exists at the drain of transistor 17 causing it to exhibit voltage gain and excessive phase shift. Capacitor 22 feeds the signal from driver 19 forward of the potentially troublesome gain stage that transistor 17 represents.

FIG. 2 is a schematic diagram of the operating circuit. Where the parts function as described in FIG. 1, the same numerals are used. Transistors 13, 14, 16 and 17 function the same.

Current source 15 is achieved by P channel transistor 15' which has its gate coupled to current mirror transistor 23 which has its gate coupled to its drain. P channel transistor 24 also has its gate returned to its drain and is coupled in series with transistor 23. Current sink 25 causes $I_8$ flow in transistors 23 and 24. These transistors when conducting develop a combined voltage drop of two P channel transistor thresholds. Transistors 23 and 15E' can be ratioed so that $I_3$ is a multiple of $I_8$. In addition, it can be seen that transistor 13 will mirror the current in transistor 15'. Thus, a ratio between these transistors can make $I_3$ a fraction of $I_1$. This means that the quiescent value of $I_1$ can be well controlled as a result of the geometric transistor ratios. As will be shown hereinafter transistors 23, 15' and 13 can be ratioed so that $I_1$ is twenty times $I_8$.

Current sink 18 is achieved by n channel transistor 18' which is current mirror driven by transistor 26 which has its gate returned to its drain. Series connected transistor 27 also has its gate returned to its drain. Current source 28 causes $I_9$ to flow in transistors 26 and 27 which therefor develop a voltage drop of two n channel transistor thresholds. These transistors are ratioed so that the ratio of $I_2/I_9$ is the same as $I_1/I_8$. Thus, relatively modest bias currents set up the amplifier quiescent current for class AB operation.

Driver 19 is functionally accomplished by emitter follower transistor 19'. This transistor has its collector dedicated to the supply terminal 10 which is the CMOS IC substrate. This device has a large current gain so that the input current supplied to terminal 12 is a very small fraction of $I_7$.

FIG. 3 is a schematic diagram of the bipolar transistor version of the FIG. 2 circuit. The various transistors are labeled with the same numerals as the FIG. 2 designations with a prime sign added to distinguish the bipolar devices. The circuit performs in substantially the same way. The x designation relate to the PNP transistor areas and the y designations relate to the NPN transistor areas. It will be noted that the same area ratios are employed and the same bias currents can be employed. Thus, a 10 microampere source 28 will bias the output transistors at 200 microamperes. It was found that the bipolar transistor version did not require the feed forward capacitor 22.

EXAMPLE

The circuit of FIG. 2 was constructed using conventional CMOS p well IC construction. The p wells for the n channel transistors were all grounded. The following transistor ratios were employed:

| Device | (Drawn Size W/L Microns) |
|---|---|
| 13 | 2200/7 |
| 14 | 1500/9 |
| 15' | 440/7 |
| 16, 17 | 150/11 |
| 18 | 600/9 |
| 23 | 110/7 |
| 24, 27 | 75/11 |
| 26 | 75/9 |

Current sink 25 and current source 28 were both operated at 10 microamperes and capacitor 22 was 10 picofarads. The quiescent were 200 microamperes. The output swing with a 2K load was within 200 millivolts of each rail when using a 4 to 16 volt power supply and the circuit was stable when driving a 100 picofarad load capacitor. Using a 10-volt supply, the power supply rejection ratio was in excess of 80 db, the circuit could source and sink up to 50 ma in class B operation, and had a slew rate of 1.7 volts per microsecond.

The invention has been described and a working example detailed. When a person skilled in the art reads the foregoiong description, alternatives and equivalents, within the spirit and intent of the invention, will become apparent. Accordingly, it is intended that the scope of the invention be limited only by the following claims.

I claim:

1. A complementary metal oxide semiconductor class AB output stage circuit having signal input and output terminals, said circuit comprising:
   positive and negative supply terminals connectable to a source of operating power;
   a p channel output transistor having a source coupled to said positive supply terminal, a drain coupled to said output terminal, and a gate;
   an n channel output transistor having a source coupled to said negative supply terminal, a drain coupled to said output terminal and a gate;
   a p channel common gate bias transistor having its source coupled to said gate of said p channel output transistor, a drain coupled to said gate of said n channel output transistor, and a gate coupled to a source of bias voltage operated at about two p channel transistor thresholds below said positive supply terminal potential;
   an n channel common gate bias transistor having a source coupled to said gate of said n channel output transistor, a drain coupled to said gate of said p channel output transistor and a gate coupled to a source of bias voltage operated at about two n channel transistor thresholds above said negative supply terminal potential;
   a constant current source coupled between said positive supply terminal and said gate of said p channel output transistor;
   a constant current sink coupled between said negative supply terminal and said gate of said n channel output transistor; and
   means for applying a signal to said gate of one of said output transistors.

2. The circuit of claim 1 wherein said means for applying a signal comprise a bipolar emitter follower transistor stage.

3. The circuit of claim 2 wherein said constant current source forms a first current mirror with a first p channel constant current transistor having its drain directly coupled to its gate, said first current mirror forms a second current mirror with said p channel output transistor, said constant current sink forms a third current mirror with a first n channel constant current transistor having its gate directly coupled to its drain, and said third current mirror forms a fourth current mirror with said said n channel output transistor.

4. The circuit of claim 3 wherein said first p channel constant current transistor is coupled in series with a second p channel constant current transistor to develop said potential about two p channel transistor thresholds below said positive supply terminal potential and a second n channel constant current transistor is coupled in series with said first n channel constant current transistor to develop said potential about two n channel transistor thresholds above said negative supply terminal potential.

5. The circuit of claim 3 wherein said first current mirror has a current gain of about four, said second current mirror has a current gain of about five, said third current mirror has a current gain of about eight, said fourth currrent mirror has a current gain of about two and one-half and said first p channel constant current transistor is operated at about the same current as said first n channel transistor whereby said p channel output transistor conducts about the same quiescent current as said n channel, output transistor.

6. The circuit of claim 5 wherein said p channel output transistor is proportioned with respect to said n channel output transistor whereby said output transistors have about the same gain.

7. The circuit of claim 6 further comprising a feed forward capacitor coupled between said gates of said p channel and said n channel output transistors.

8. A complementary bipolar transistor class AB output stage having signal input and output terminals, said circuit comprising:
positive and negative supply terminals connectable to a source of operating power;
a PNP output transistor having an emitter coupled to said positive supply terminal, a collector coupled to said output terminal, and a base;
an NPN output transistor having an emitter coupled to said negative supply terminal, a collector coupled to said output terminal, and a base;
a PNP common base bias transistor having an emitter coupled to said base of said PNP output transistor, a collector coupled to said base of said NPN output transistor, and a base coupled to a source of bias voltage operated at about two $V_{BE}$ below said positive supply terminal potential;
an NPN common base bias transistor having an emitter coupled to said base of said NPN output transistor, a collector coupled to said base of said PNP output transistor, and a base coupled to a source of bias voltage operated at about two $V_{BE}$ above said negative supply terminal potential;
a constant current source coupled between said positive supply terminal and said base of said PNP output transistor;
a constant current sink coupled between said negative supply terminal and said base of said NPN output transistor; and
means for applying a signal to said base of one of said output transistors.

9. The circuit of claim 8 wherein said means for applying a signal comprise a bipolar emitter follower transistor stage.

10. The circuit of claim 9 wherein said constant current source forms a first current mirror with a first PNP constant current transistor having its collector directly coupled to its base, said first current mirror forms a second current mirror with said PNP output transistor, said constant current sink forms a third current mirror with a first NPN constant current transistor having its collector directly coupled to its base, and said third current mirror forms a fourth current mirror with said NPN output transistor.

11. The circuit of claim 10 wherein said first PNP constant current transistor is coupled in series with a second PNP constant current transistor to develop said potential about two $V_{BE}$ below said postive supply terminal potential and a second NPN onstant current transistor is coupled in series with said first NPN constant current transistor to develop said potential about 2 $V_{BE}$ above said negative supply terminal potential.

12. The circuit of claim 11 wherein said first current mirror has a current gain of about four, said second current mirror has a current gain of about five, said third current has a current gain of about 8, said fourth current mirror has a current gain of about two and one-half and said first PNP constant current transistor is operated at about the same current as said first NPN transistor whereby said PNP output transistor conducts about the same quiescent current as said NPN output transistor.

* * * * *